United States Patent
Yamada et al.

(10) Patent No.: US 9,832,893 B2
(45) Date of Patent: Nov. 28, 2017

(54) ELECTRONIC APPARATUS WITH CASE HAVING UNITARY FIXTURE REINFORCEMENT AND ROOF FOR CONNECTOR APERTURE

(71) Applicant: FUJITSU TEN LIMITED, Kobe-shi, Hyogo (JP)

(72) Inventors: Shimpei Yamada, Kobe (JP); Takashi Ogitani, Kobe (JP); Akira Nishikawa, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 0 days.

(21) Appl. No.: 15/234,069

(22) Filed: Aug. 11, 2016

(65) Prior Publication Data
US 2017/0086318 A1    Mar. 23, 2017

(30) Foreign Application Priority Data

Sep. 17, 2015  (JP) .................................. 2015-183525

(51) Int. Cl.
H05K 5/00 (2006.01)
(52) U.S. Cl.
CPC .................................. H05K 5/0047 (2013.01)
(58) Field of Classification Search
CPC .............................. H05K 5/00; H05K 5/0047
See application file for complete search history.

(56) References Cited

U.S. PATENT DOCUMENTS

| | | | | |
|---|---|---|---|---|
| 6,462,270 B1* | 10/2002 | Depp | ..................... | H02G 3/088 174/50 |
| 6,635,823 B2* | 10/2003 | Kasai | ..................... | H02G 3/088 174/50 |
| 6,774,309 B2* | 8/2004 | Kasai | ....................... | H02G 3/14 174/17 R |
| 7,671,275 B2* | 3/2010 | Kubota | .............. | H01R 13/5227 174/17 R |
| 2014/0197656 A1* | 7/2014 | Ochiai | ................... | B62K 19/30 296/37.1 |
| 2015/0077956 A1* | 3/2015 | Sano | .................... | H05K 5/0069 361/752 |

FOREIGN PATENT DOCUMENTS

| | | |
|---|---|---|
| JP | H11-233955 A | 8/1999 |
| JP | 2014-093379 A | 5/2014 |
| JP | 2014-156168 A | 8/2014 |

* cited by examiner

Primary Examiner — Xanthia C Cunningham
(74) Attorney, Agent, or Firm — Oliff PLC

(57) ABSTRACT

A first roof extends over and covers an area above an aperture through which an input connector is accessible, so as to receive water drops flowing down along a side surface of a case. A first reinforcement reinforces a fixture by which the case is fixed to a fixed surface. The first roof and the first reinforcement are a single piece of material. Thus, since the first roof and the first reinforcement are the single piece of material, if the first roof is provided to the case, there is no need to form the first roof and the first reinforcement separately. Therefore, it is possible to prevent generation of additional mold production cost and material cost for the first roof.

10 Claims, 6 Drawing Sheets

ELECTRONIC APPARATUS WITH CASE HAVING UNITARY FIXTURE REINFORCEMENT AND ROOF FOR CONNECTOR APERTURE

BACKGROUND OF THE INVENTION

Field of the Invention

The invention relates to a technology of a water resistant structure that prevents water drops from entering a case.

Description of the Background Art

Conventionally, sometimes, moisture condensed or water dripped on a case of an electronic control apparatus installed in a vehicle, due to temperature changes in a cabin of the vehicle, water leak from an air-conditioning duct, etc. Moreover, recently, a connector increasingly has been required to be provided on a side surface of the electronic control apparatus because of diversified functions and downsizing of the electronic control apparatus as well as limited space for installation of the apparatus in the vehicle. If the connector is provided on the side surface of the electronic control apparatus, water drops generated on the case of the electronic control apparatus go down along the side surface of the case and enter a portion of the connector. In this case, short circuit may occur between terminals of the connectors and may cause a problem to a control function of the electronic control apparatus.

Therefore, a technology is known that a roof or a hood is provided above the connector on the side surface of the electronic control apparatus so as to prevent water from entering the connector if the water drops are generated. Since the roof or the hood prevents water drops from entering the connector, such a technology ensures a proper control of the electronic control apparatus because short circuit does not occur to the connector.

However, in a case where the roof or the hood is provided newly to the case, material cost for the roof/hood is newly generated, and thus the roof/hood is a factor of an increase in a production cost of the case.

SUMMARY OF THE INVENTION

According to one aspect of the invention, an electronic apparatus includes: a case in which an electronic substrate having a connector is stored; an aperture formed in a side surface of the case, the connector being accessible through the aperture; a fixture by which the case is fixed to a mounting surface, the fixture projecting outward from the side surface of the case and the fixture extending substantially in a vertical direction when the case is fixed to the mounting surface; a first roof that extends over and covers an area above the aperture so as to receive water drops flowing down along the side surface of the case to thereby prevent the water drops from reaching the aperture, the first roof projecting outward from the side surface of the case; and a first reinforcement that connects a portion of the fixture to the side surface of the case to reinforce the fixture, the portion of the fixture including an end portion of the fixture that extends in the vertical direction. The first roof and the first reinforcement are a single piece of material.

Thus, the first roof and the first reinforcement do not have to be provided separately so that an increase in production cost of the case can be prevented.

According to another aspect of the invention, the electronic apparatus further includes: a second roof that extends over and covers the area above the aperture so as to receive the water drops flowing down along the side surface of the case, the second roof projecting outward from the side surface of the case. The second roof is located vertically above the first roof and is shorter than the first roof so that the water drops received by the second roof subsequently flow to the first roof.

The second roof is located vertically above the first roof and is shorter than the first roof. Thus, the first roof can easily receive the water drops flowing down along the side surface of the case.

Therefore, an object of the invention is to provide a technology for preventing an increase in production cost of a case that includes a roof additionally.

These and other objects, features, aspects and advantages of the invention will become more apparent from the following detailed description of the invention when taken in conjunction with the accompanying drawings.

DESCRIPTION OF THE EMBODIMENTS

An embodiment of the invention is described below with reference to the drawings.

1. Embodiment

<1-1. Structure of Electronic Apparatus>

Figure 1:
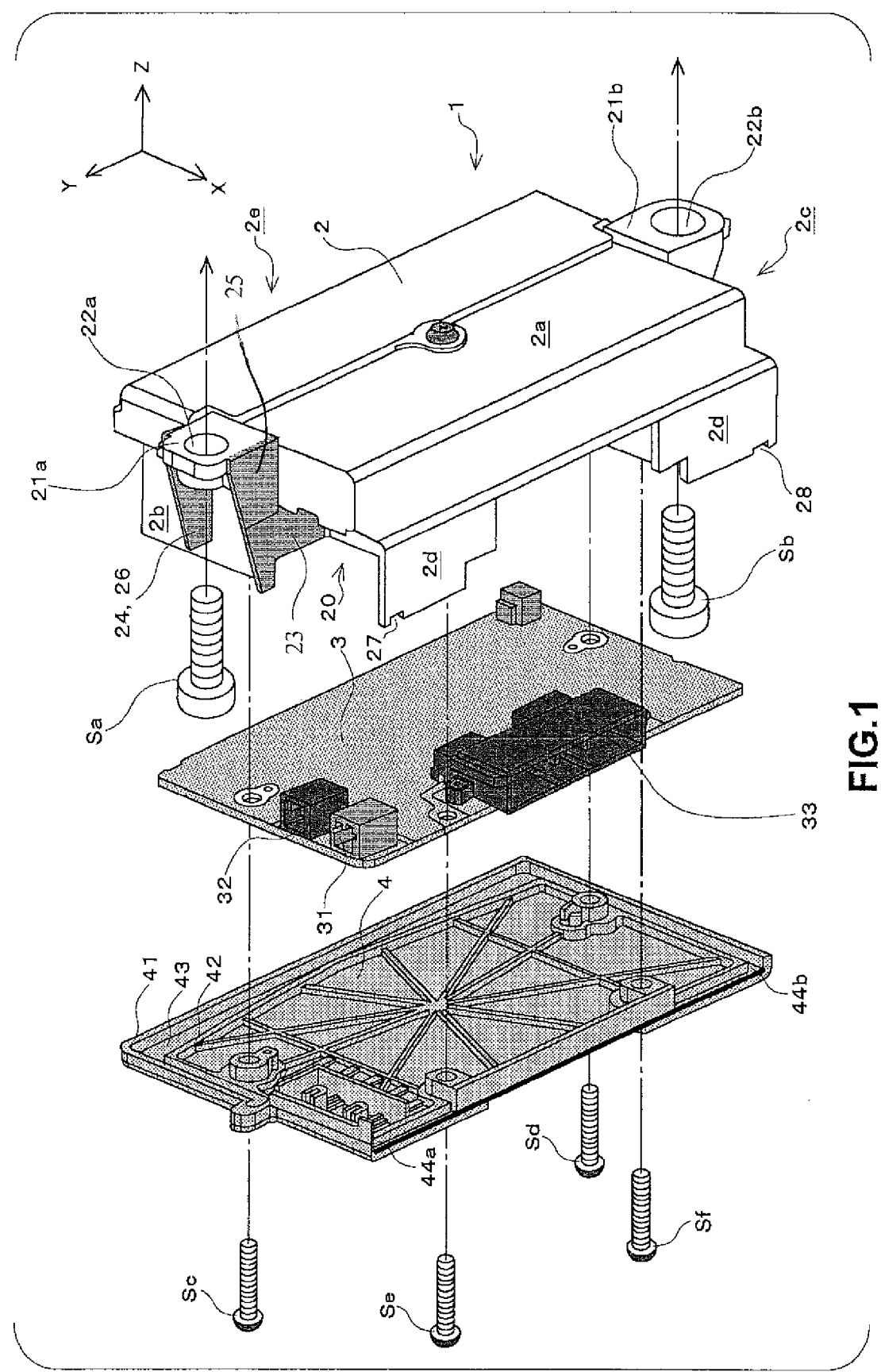
FIG. 1 illustrates an exploded perspective view of an electronic apparatus.

FIG. 1 illustrates an exploded perspective view of an electronic apparatus 1. The electronic apparatus 1 is an apparatus, for example, that is installed in a vehicle, such as an automobile, and that is connected to a telephone antenna and the like for external communications. The electronic apparatus 1 is fixed to a bracket, not illustrated, with bolts Sa and Sb. The bracket is fixed to a fixed surface (body) of the vehicle so that the electronic apparatus 1 is installed in a predetermined position of the vehicle.

For the description below, a direction and an orientation will be indicated based on a three dimensional Cartesian coordinates shown in FIG. 1. The Cartesian coordinates show a rough direction of the electronic apparatus 1 (a case 2, an electronic substrate 3 and a cover 4) fixed to the fixed surface of the vehicle. The Cartesian coordinates are fixed relative to the electronic apparatus 1 in each drawing. An X direction shows a lower side (substantially a gravity direction) of the electronic apparatus 1. A Y direction shows a right side of the electronic apparatus 1 (a right side of the cover 4 viewed from outside the electronic apparatus 1). A Z direction shows a backside of the electronic apparatus 1 (a direction in which the electronic apparatus 1 faces an installed surface when being installed). If a front-back direction, a horizontal direction and a vertical direction are indicated in the description below, those directions are directions shown in FIG. 1.

The electronic apparatus 1 includes the case 2, the electronic substrate 3 and the cover 4. The case 2, the electronic substrate 3 and the cover 4 are fixed to one another with bolts Sc, Sd, Se and Sf to form the electronic apparatus 1.

Especially, the case 2 and the cover 4 are fixed to each other to form a housing in which the electronic substrate 3 is stored.

The case 2 is a substantially box-shaped container that includes the electronic substrate 3. It is recommended that the case 2 should be formed from resin, such as polypropylene (PP), because PP is lightweight and is excellent in water resistance. The case 2 includes a substantially rectangular front surface 2a, two side surfaces 2b and 2c substantially orthogonal to the front surface 2a, a bottom surface 2d and an upper surface 2e. The case 2 functions as a case portion.

The side surface 2b includes an aperture 20, a fixture 21a, a first roof 23, a second roof 24, a first reinforcement 25 and a second reinforcement 26. The side surface 2c includes a fixture 21b. The side surface 2c is formed so as to be bilaterally symmetrical to the side surface 2b.

When the case 2 and the electronic substrate 3 are fixed to each other, the aperture 20 is formed such that connection ends of input connectors 31 and 32, later described, are not covered by the case 2.

The bottom surface 2d includes drain outlets 27 and 28.

The fixtures 21a and 21b are formed on the side surface 2b, projecting outward from the case 2 and extending substantially in the vertical direction (-+X direction). The bolts Sa and Sb go through fixing holes 22a and 22b of the fixtures 21a and 21b, respectively, to fix the case 2 to the fixed surface via the bracket and the like. In other words, the electronic apparatus 1 is fixed to the body of the vehicle by the fixtures 21a and 21b.

The first roof 23 and the second roof 24 are formed above (-X side) the aperture 20 so as to extend over and cover areas above the aperture 20, respectively, projecting outward from the case 2. The first roof 23 and the second roof 24 project outward (+Y side) from the case 2 so as to receive water drops flowing down along the side surface 2b. Thus, if the water drops flow down along the side surface 2b, the water drops are prevented from entering the input connectors 31 and 32 uncovered in the aperture 20.

The first reinforcement 25 connects a lower (+X direction) end portion of the fixture 21a to the side surface 2b, and thus reinforces the fixture 21a projecting outward (+Y side) from the case 2. The second reinforcement 26 connects an upper end portion of the fixture 21a to the side surface 2b, and thus reinforces the fixture 21a projecting outward (+Y side) from the case 2.

The first roof 23 and the first reinforcement 25 are a single piece of material. Functions of the first roof 23 and the first reinforcement 25 as the single piece of material will be described later.

The drain outlets 27 and 28 are apertures formed on the bottom surface 2d of the case 2. The water drops that entered the case 2 from a joint between the case 2 and the cover 4 are drained from the electronic apparatus 1 via the drain outlets 27 and 28.

The electronic substrate 3 includes the input connectors 31 and 32, an output connector 33, an electronic unit and an electronic circuit, and the electronic substrate 3 is an electronic circuit board for controlling an electronic device. The electronic substrate 3 controls the electronic device, such as a vehicle-mounted telephone. The electronic unit and the electronic circuit are not illustrated in the drawings.

The input connectors 31 and 32 are connected to a vehicle-mounted antenna. The antenna is, for example, a communication antenna for a vehicle-mounted telephone or a GPS antenna for detecting a position of the vehicle.

Telephone call data received by the communication antenna is sent to the telephone via the output connector 33. Moreover, position data acquired by the GPS antenna is output to a controller area network (CAN) provided in the vehicle via the output connector 33.

The cover 4 functions as a lid for the case 2 including the electronic substrate 3. It is recommended that the cover 4 should be formed from resin, such as PP, for the same reason as the case 2. The cover 4 includes an outer rim 41, a drainage wall 42, a drainage groove 43 and drainage outlets 44. A function of the cover 4 of draining the water drops that entered the case 2 from the joint between the cover 4 and the case 2 will be described later.

Figure 2:
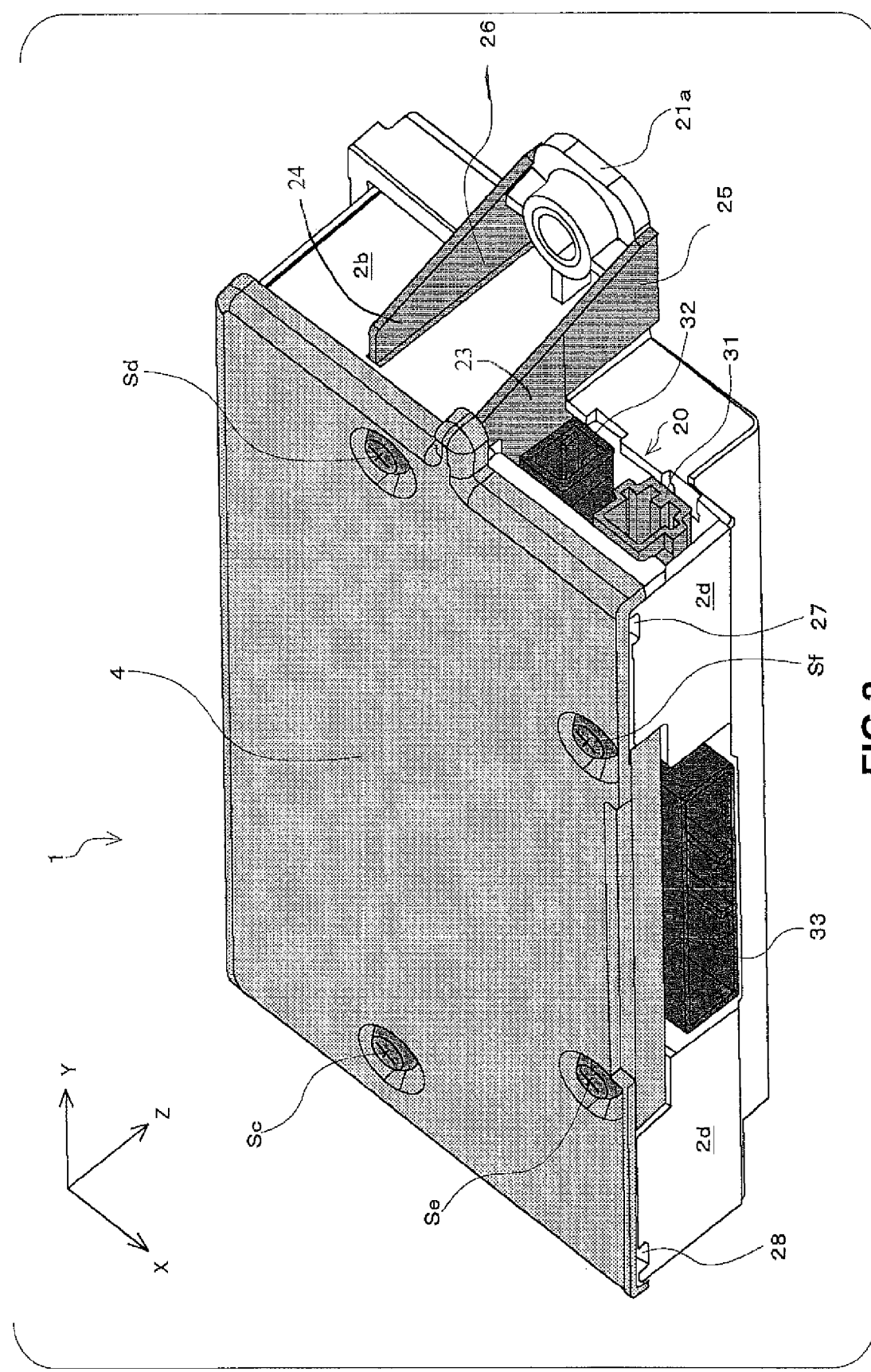
FIG. 2 illustrates a perspective view of the electronic apparatus.

FIG. 2 illustrates a perspective view of the electronic apparatus 1 to show the first roof 23 and the first reinforcement 25. FIG. 2 illustrates the electronic apparatus 1 formed by fixing the case 2, the electronic substrate 3 and the cover 4 to one another by the four bolts Sc, Sd, Se and Sf The first roof 23 extends over and covers the area above (-X side) the aperture 20 through which the input connectors 31 and 32 are accessible. The first roof 23 is formed, projecting outward (+Y side) from the case 2, and receives the water drops flowing down along the side surface 2b.

The first reinforcement 25 connects the lower (+X direction) end portion of the fixture 21a to the side surface 2b to reinforce the fixture 21a. In other words, the fixture 21a is formed, projecting outward (+Y side) from the side surface 2b of the case 2 and extending substantially in the vertical direction (-+X direction). The fixture 21a is vulnerable to stress applied in the front-back direction (+-Z direction) of the case 2. Therefore, the first reinforcement 25 extends in the front-back direction (+-Z direction) of the case 2 so as to reinforce repulsive force to the stress applied on the fixture 21a in the front-back direction (+-Z direction).

Here, a relationship between the first roof 23 and the first reinforcement 25 is as follows. The first roof 23 and the first reinforcement 25 are the single piece of material. In other words, the first roof 23 is used as the first reinforcement 25. Therefore, the first roof 23 functions as the first reinforcement 25. The first reinforcement 25 functions as the first roof 23.

Thus, the first roof 23 and the first reinforcement 25 do not have to be formed separately so that an increase in production cost of the electronic apparatus 1 can be prevented. Structures and a relationship of the second roof 24 and the second reinforcement 26 are substantially the same as the structures and the relationship of the first roof 23 and the first reinforcement 25.

Moreover, a function of the first reinforcement 25 is as follows. The electronic apparatus 1 is fixed to the fixed surface by the first reinforcement 25. Therefore, for example, if the vehicle equipped with the electronic apparatus 1 collides against an object, a large stress is applied to the case 2. Since the fixture 21a is formed, projecting outward (+Y side) from the case 2, if the large stress is applied to the fixture 21a, the fixture 21a may be broken at the joint between the case 2 and the fixture 21a. In this case, the electronic apparatus 1 may fall down in the vehicle and may receive an impact so that a problem may occur to a control function of the electronic apparatus 1. However, since the fixture 21a is reinforced by the first reinforcement 25, even if a large stress is applied to the fixture 21a, it is possible to avoid breakage of the fixture 21a and to ensure the appropriate control function of the electronic apparatus 1. A function of the second reinforcement 26 is substantially the same as the function of the first reinforcement 25.

Figure 3:
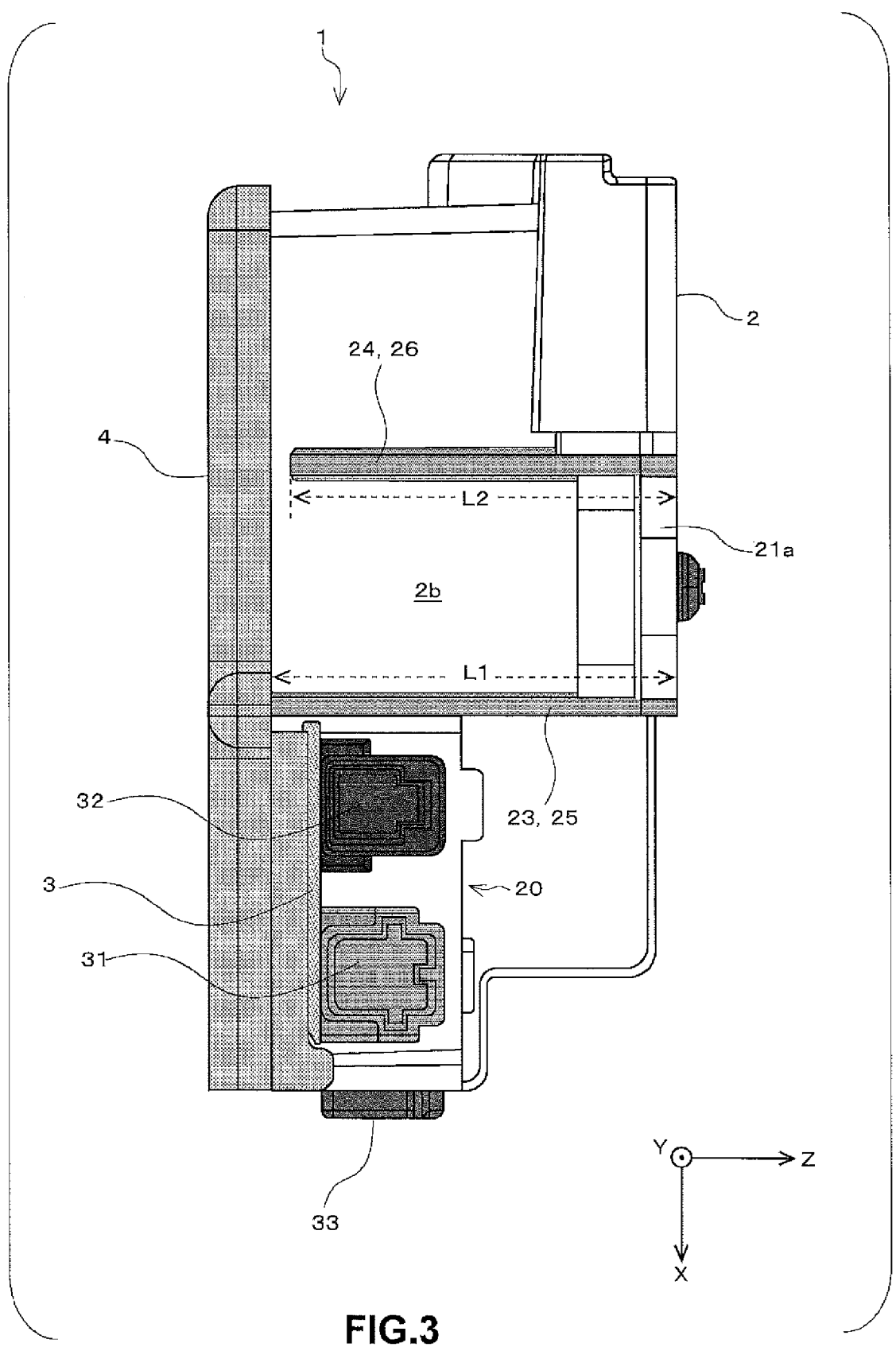
FIG. 3 illustrates a side view of the electronic apparatus.

FIG. 3 illustrates the side surface 2b of the electronic apparatus 1 to show lengths of the first roof 23 and the second roof 24 in the front-back direction (−+Z direction).

A length (L1) of the first roof 23 in the front-back direction (−+Z direction) extends from a side of the fixture 21a (+Z side) to a side of the cover 4 (−Z side). The second roof 24 is formed so as to extend over and cover the area above (−X side) the aperture 20, projecting outward (+Y side) from the case 2. A length (L2) of the second roof 24 in the front-back direction (−+Z direction) extends from the side of the fixture 21a (+Z side) toward the cover 4 and does not reach the side of the cover 4 (−Z side). In other words, the second roof 24 is located above (−X side) the first roof 23 and is shorter than the first roof 23.

Since a positional relationship between the first roof 23 and the second roof 24 and the lengths thereof are as described above, the water drops flowing along the side surface 2b of the electronic apparatus 1 can be effectively received by the first roof 23 and the second roof 24. Thus, the water drops generated on the electronic apparatus 1 can be effectively prevented from entering the electronic apparatus 1. Next described is a function of the first roof 23 and the second roof 24 of effectively receiving the water drops flowing along the side surface 2b of the electronic apparatus 1.

Figure 4:
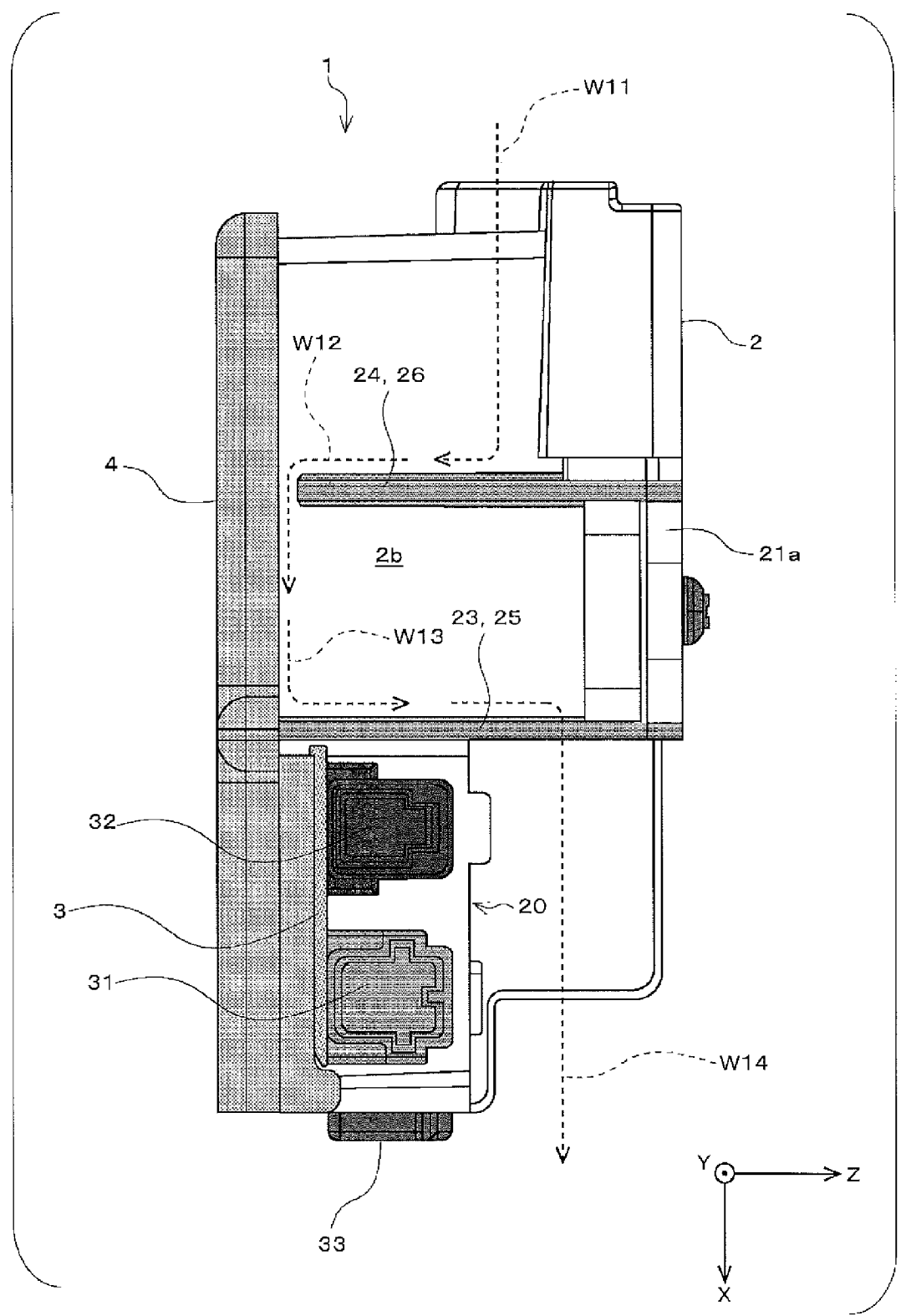
FIG. 4 illustrates a side view of the electronic apparatus.

FIG. 4 illustrates the side surface 2b of the electronic apparatus 1 to show a flowing route of water drops on the side surface 2b.

The water drops on the side surface 2b flow down along the side surface 2b and reach the second roof 24 (a route W11). Once reaching the second roof 24, the water drops are pushed out by another water drop that reached the second roof 24 afterward, and fall downward (+X direction) through a gap between the second roof 24 and the cover 4 (a route W12). Once falling downward (+X direction) through the gap between the second roof 24 and the cover 4, the water drops reach the first roof 23. Then, the water drops flow in a direction toward the fixture 21a (+Z direction) on the first roof 23 (a route W13). The water drops flow toward the fixture 21a on the first roof 23, fall from the first roof 23, and then are drained outside the electronic apparatus 1 (a route W14).

Since the electronic apparatus 1 includes the first roof 23 and the second roof 24 as described above, the water drops do not reach the input connector 31 or the input connector 32 even if the water drops flow along the side surface 2b. Therefore, the first roof 23 and the second roof 24 can prevent short circuit of the input connectors 31 and 32, and then can prevent the electronic apparatus 1 from having a problem with the control function.

Moreover, the second roof 24 located above the first roof 23 first receives the water drops so that a momentum of the flowing water drops is decreased. The first roof 23 receives the water drops after the momentum of the water drops was decreased so that the first roof 23 easily receives the flowing water drops. In other words, the first roof 23 located close to the input connectors 31 and 32 is prevented from first receiving the flowing water drops so that spatter of the water drops is prevented. Thus, droplets of the water drops are prevented from being attached to the input connectors 31 and 32.

Moreover, since the water drops are drained from the first roof 23, not from the second roof 24, the water drops can be drained after falling from a lower position of the electronic apparatus 1. Since the water drops are drained after falling from the lower position of the electronic apparatus 1, spatter of the water drops is prevented after the water drops fell, and droplets of the water drops are prevented from being attached to the input connectors 31 and 32.

Figure 5:
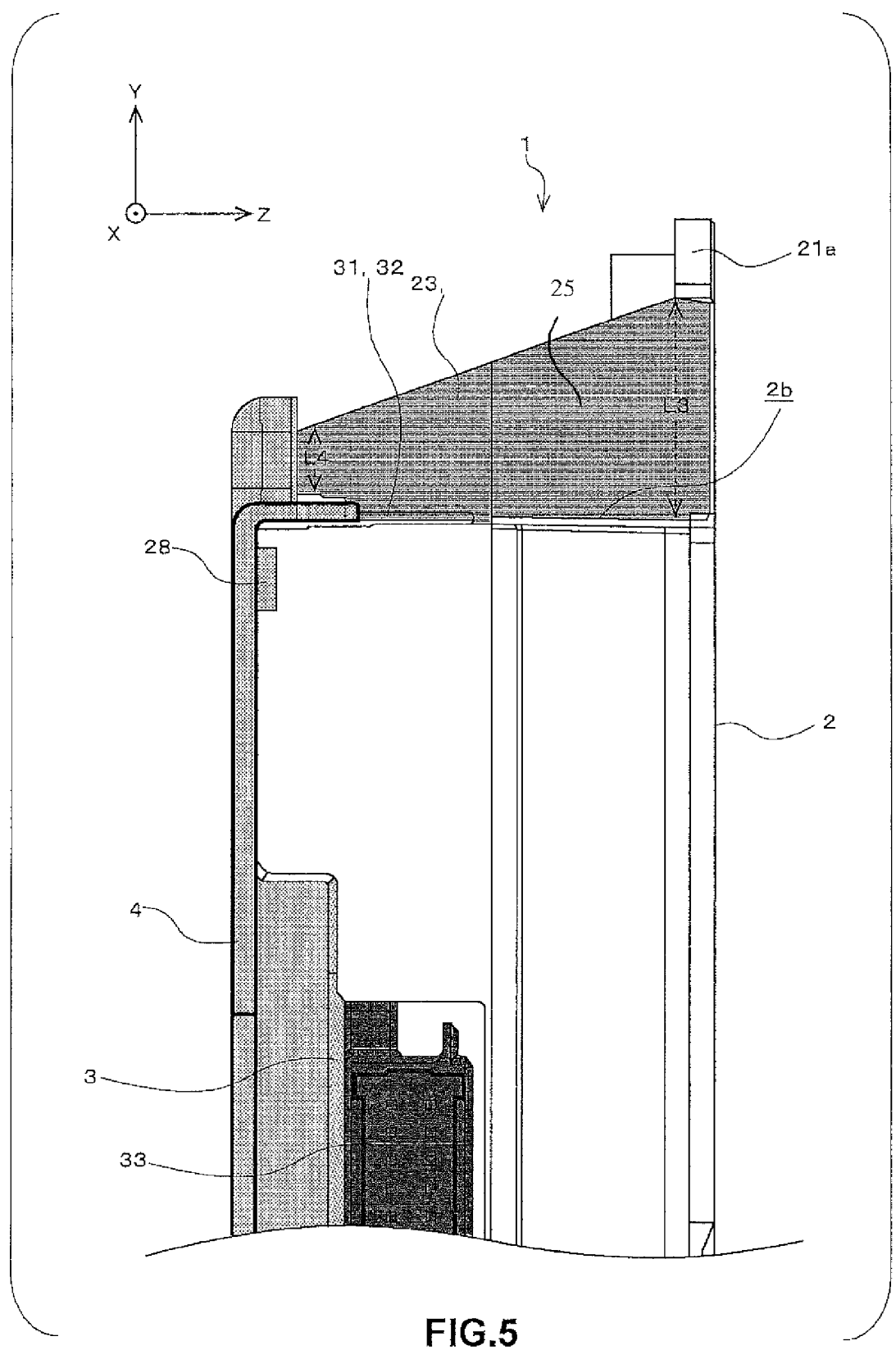
FIG. 5 illustrates a bottom view of the electronic apparatus.

FIG. 5 illustrates a structure of the bottom surface 2d of the electronic apparatus 1 to show lengths of the first roof 23 projecting from the side surface 2b and to show a slope shape of the first reinforcement 25 relative to the side surface 2b.

The lengths of the first roof 23 projecting from the side surface 2b will be first described. A length (L4) of the first roof 23 projecting from the side surface 2b is smaller (shorter) on a side of the input connectors 31 and 32 (−Z side) as compared to a length (L3) of the first roof 23 on the side of the fixture 21a (+Z side). In other words, the first roof 23 projects from the side surface 2b by a lesser amount at an end of the side surface 2b as compared to at an opposite end of the side surface 2b.

Therefore, a user can easily operate connection members connected to the input connectors 31 and 32 without interruption by the first roof 23. In other words, the user can easily pinch the connection members to plug into or out of the connectors.

However, if a length of the first roof 23 projecting from the side surface 2b on the side of the input connectors 31 and 32 is greater (longer) than the length (L4) or equal to the length (L3) of the first roof 23 projecting from the side surface 2b on the side of the fixture 21a, the user is interrupted by the first roof 23, and thus it is difficult for the user to pinch the connection members connected to the input connectors 31 and 32. In this case, the user has a problem with plugging the connection members into or out of the connectors. Therefore, it is recommended that the length of the first roof 23 projecting from the side surface 2b should be smaller (shorter) on the side of the input connector 31 as compared to the length of the first roof 23 on the side of the fixture 21a.

Next, the slope shape of the first reinforcement 25 relative to the side surface 2b will be described. The first reinforcement 25 is formed so as to be sloped relative to the side surface 2b. In other words, the first reinforcement 25 is sloped relative to the side surface 2b such that a height of the first reinforcement 25 is smaller (lower) on the side of the input connectors 31 and 32 (−Z side) as compared to a height of the first reinforcement 25 on the side of the fixture 21a (+Z side). Therefore, the first reinforcement 25 is formed smaller (lower) relative to the side surface 2b as the first reinforcement 25 extends further toward the side of the input connectors 31 and 32 (−Z side). However, since the first reinforcement 25 is formed greater (higher) on the side of the fixture 21a (+Z side), the first reinforcement 25 can maintain a strength thereof that reinforces the fixture 21a.

<1-2. Cover Structure>

Figure 6:
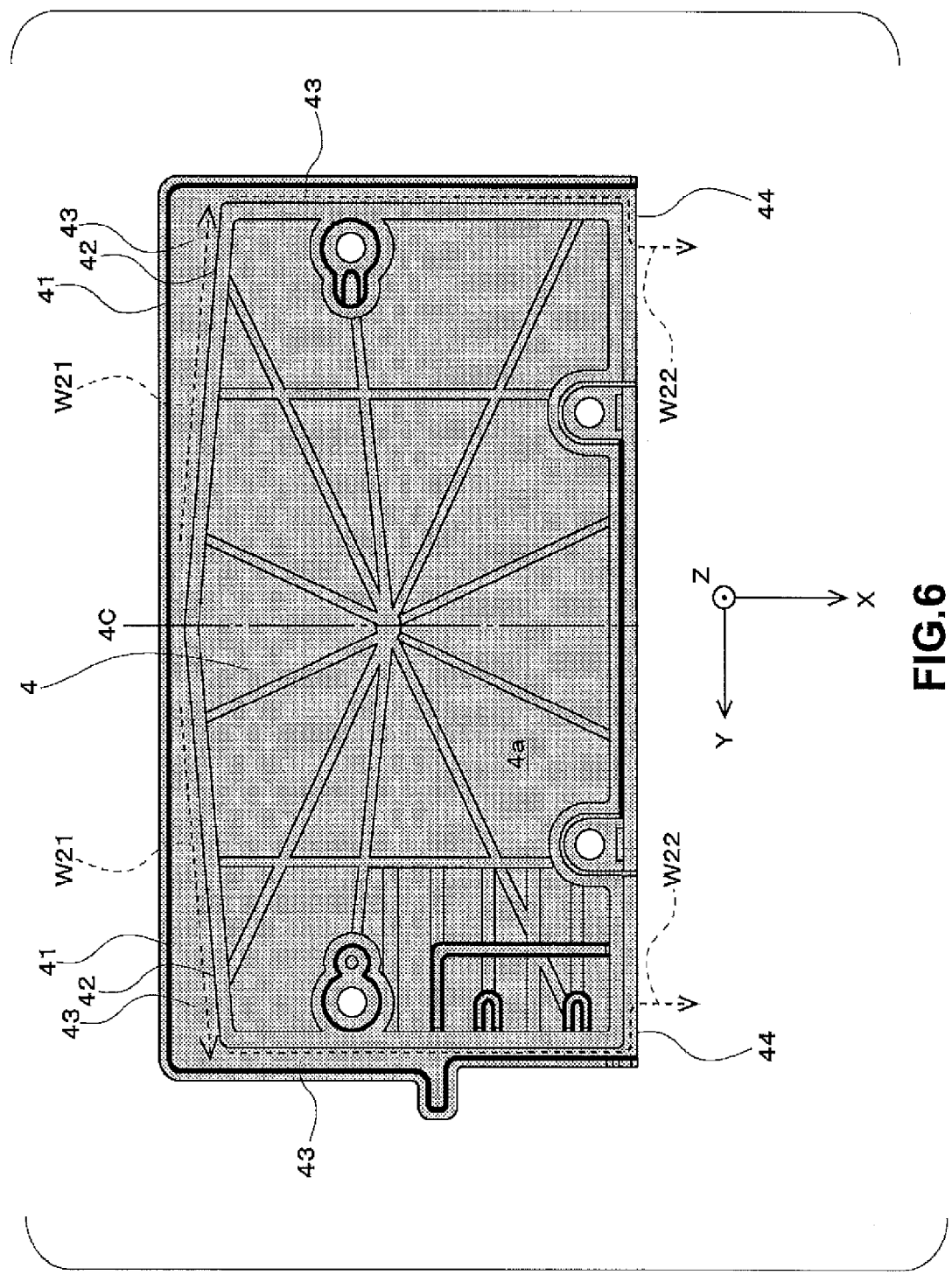
FIG. 6 illustrates a back surface view of a cover.

FIG. 6 illustrates a structure of a back surface (a surface viewed from +Z side to −Z side) 4a of the cover 4. The back surface 4a of the cover 4 has a function of draining the water drops that entered the electronic apparatus 1 from the joint between the cover 4 and the case 2. The back surface 4a of the cover 4 includes the outer rim 41, the drainage wall 42, the drainage groove 43 and the drainage outlets 44.

The outer rim 41 is an outer portion of the back surface 4a. The outer rim 41 is formed, projecting forward (+Z direction) from the back surface 4a only by a few millimeters.

The drainage wall 42 is formed slightly inside the outer rim 41 of the back surface 4a. Like the outer rim 41, the drainage wall 42 is formed, projecting forward (+Z direction) from the back surface 4a only by a few millimeters. The drainage wall 42 extends downward (+X direction)

slantwise both to the left and right from a horizontal center 4C of the back surface 4a. When reaching a point slightly inside the outer rim 41, the drainage wall 42 extends downward (+X direction) until reaching a point slightly inside a lower end (end portion in +X direction) of the back surface 4a. When reaching the point slightly inside the lower end of the back surface 4a, the drainage wall 42 extends inward (+Y or −Y direction) of the back surface 4a.

Since the drainage wall 42 is formed as a wall surface slightly inside the outer rim 41, it is possible to prevent the water drops that entered the electronic apparatus 1 from the joint between the cover 4 and the case 2 from going further inside the electronic apparatus 1. Especially, since the drainage wall 42 extends downward slantwise both to the left and right from the horizontal center 4C located on an upper side (−X side) of the back surface 4a, the water drops that entered from an upper portion of the electronic apparatus 1 are equally distributed to the left and right and are gradually drained outside.

The drainage groove 43 is a ditch formed between the outer rim 41 and the drainage wall 42. The drainage groove 43 abuts the upper surface 2e, the side surface 2b and the side surface 2c of the case 2. The drainage groove 43 conveys and drains the water drops that entered from the upper portion of the electronic apparatus 1 or from the side surface 2b of the case 2.

Each of the drainage outlets 44 is a portion of the back surface 4a, not having the outer rim 41. The drainage outlets 44 are formed on a lower side (+X side) of the back surface 4a. The water drops conveyed in the drainage groove 43 are drained outside from the drainage outlets 44.

Next described is a conveyed course of the water drops that entered from the upper portion of the electronic apparatus 1. It is easy for water drops to enter the electronic apparatus 1 from the upper portion thereof because the water drops generated on the upper portion of the electronic apparatus 1 penetrate inward due to the gravity. The water drops that entered from the upper portion of the electronic apparatus 1 are divided to a left side (+Y side) and a right side (−Y side) along the drainage groove 43 and are gradually conveyed outward (a course W21). When reaching a left end portion or a right end portion of the drainage groove 43, the water drops are conveyed downward (+X direction) along the drainage groove 43 (a course W22) and are drained outside from the electronic apparatus 1 via the drainage outlets 44. The water drops also penetrate from the side surface 2b of the electronic apparatus 1 (the case 2). The water drops that penetrated from the side surface 2b are conveyed in the course W22 and are drained.

Due to such a shape of the back surface 4a of the cover 4, even if the water drops entered the electronic apparatus 1, the water drops are not attached to the input connectors 31 and 32 provided to the electronic substrate 3 included inside the case 2 as well as to the electronic unit and electronic circuits. Thus, since no short circuit occurs between the electronic unit and a wiring, a problem to be caused by the water drops can be prevented from occurring to the electronic apparatus 1.

As described above, in the electronic apparatus 1 of the invention in this embodiment, the first roof 23 that extends over and covers the area above the aperture 20 through which the input connectors 31 and 32 are accessible and that receives the water drops flowing down along the side surface 2b is formed as one unit with the first reinforcement 25 that reinforces the fixture 21a that fixes the case 2 to the fixed surface.

Thus, if the first roof 23 is provided to the case 2, there is no need to include the first roof 23 and the first reinforcement 25 separately because the first roof 23 and the first reinforcement 25 are the single piece of material. Thus, it is possible to prevent generation of additional mold production cost and material cost for the first roof 23. Therefore, it is possible to prevent an increase in production cost of the case 2. Moreover, since it is possible to prevent water drops from entering the input connectors 31 and 32 if the input connectors 31 and 32 are provided on the side surface 2b of the case 2, choice of a layout of a connector can be wider.

Moreover, the second roof 24 of the electronic apparatus 1 in this embodiment is formed so as to extend over and cover the area above the aperture 20 and to receive the water drops flowing down along the side surface 2b, projecting outward from the case 2 above the first roof 23, and the second roof 24 is shorter than the first roof 23.

Thus, the first roof 23 formed as one unit with the first reinforcement 25 can easily receive the water drops flowing down along the side surface 2b. Thus, it is possible to effectively prevent the water drops from entering the input connectors 31 and 32. In other words, it is possible to prevent a problem to be caused by the water drops from occurring to the control function of the electronic apparatus 1.

2. Modification

The embodiment of the invention is described above. However, the invention is not limited to the foregoing embodiment. Various modifications of the invention are possible. Examples of those modifications will be described below. Any form of the embodiment described above and the modifications described below may be arbitrarily combined with one another.

In the foregoing embodiment, the electronic apparatus 1 is installed in a vehicle, such as an automobile. However, the electronic apparatus 1 does not have to be installed in a vehicle. The electronic apparatus 1 may be an electronic apparatus that is provided to a place in which a water drop is possibly generated.

In the foregoing embodiment, the electronic apparatus 1 is connected to a telephone antenna for external communications. However, the electronic apparatus 1 does not have to be an apparatus for external communication. The electronic apparatus 1 may be an apparatus for electronic control. For example, the electronic apparatus 1 may be an apparatus that controls an airbag, a power steering or an engine.

In the foregoing embodiment, it is recommended that the case 2 and the cover 4 should be formed from resin, such as polypropylene (PP). However, the case 2 and the cover 4 may not be made of PP. The case 2 and the cover 4 may be parts die-cast metal, such as ADC 12, because aluminum die-cast parts are excellent in cutting, casting, distribution and accessibility.

While the invention has been shown and described in detail, the foregoing description is in all aspects illustrative and not restrictive. It is therefore understood that numerous other modifications and variations can be devised without departing from the scope of the invention.

What is claimed is:

1. An electronic apparatus comprising:
   a case in which an electronic substrate having a connector is stored;
   an aperture formed in a side surface of the case, the connector being accessible through the aperture;

a fixture by which the case is fixed to a mounting surface, the fixture projecting outward from the side surface of the case and the fixture extending substantially in a vertical direction when the case is fixed to the mounting surface;

a first roof that extends over and covers an area above the aperture so as to receive water drops flowing down along the side surface of the case to thereby prevent the water drops from reaching the aperture, the first roof projecting outward from the side surface of the case; and a first reinforcement that connects a portion of the fixture to the side surface of the case to reinforce the fixture, the portion of the fixture including an end portion of the fixture that extends in the vertical direction, wherein the first roof and the first reinforcement are a single piece of material that includes a wall projecting outward from the side surface, the wall having a first edge fixed to the side surface and a second edge fixed to the end portion of the fixture.

2. The electronic apparatus according to claim 1, wherein the first reinforcement projects from the side surface by different amounts along a length of the first reinforcement so as to be sloped.

3. The electronic apparatus according to claim 1, further comprising:

a cover that abuts the case, and that covers the electronic substrate stored in the case, wherein the cover abuts an edge of the side surface of the case and includes a drainage groove that conveys any of the water drops that entered the electronic apparatus from the side surface.

4. The electronic apparatus according to claim 1, wherein the electronic apparatus is configured to be installed in a vehicle.

5. The electronic apparatus according to claim 4, wherein the electronic apparatus is configured to be connected to a telephone antenna for communications with an outside of the vehicle.

6. The electronic apparatus according to claim 1, wherein the case is formed from resin.

7. The electronic apparatus according to claim 1, wherein the side surface extends in a first plane, the fixture extends in a second plane perpendicular to the first plane, and the wall extends in a third plane perpendicular to the first and second planes.

8. The electronic apparatus according to claim 1, wherein the fixture and the wall are arranged relative to the side surface so that, when the case is fixed to the mounting surface by the fixture, the fixture extends substantially in the vertical direction, the side surface extends substantially in the vertical direction, and the wall extends substantially in a horizontal direction.

9. An electronic apparatus comprising:

a case in which an electronic substrate having a connector is stored;

an aperture formed in a side surface of the case, the connector being accessible through the aperture;

a fixture by which the case is fixed to a mounting surface, the fixture projecting outward from the side surface of the case and the fixture extending substantially in a vertical direction when the case is fixed to the mounting surface;

a first roof that extends over and covers an area above the aperture so as to receive water drops flowing down along the side surface of the case to thereby prevent the water drops from reaching the aperture, the first roof projecting outward from the side surface of the case;

a first reinforcement that connects a portion of the fixture to the side surface of the case to reinforce the fixture, the portion of the fixture including an end portion of the fixture that extends in the vertical direction; and a second roof that extends over and covers the area above the aperture so as to receive the water drops flowing down along the side surface of the case, the second roof projecting outward from the side surface of the case, wherein the first roof and the first reinforcement are a single piece of material, and the second roof is located vertically above the first roof and is shorter than the first roof so that the water drops received by the second roof subsequently flow to the first roof.

10. An electronic apparatus comprising:

a case in which an electronic substrate having a connector is stored;

an aperture formed in a side surface of the case, the connector being accessible through the aperture;

a fixture by which the case is fixed to a mounting surface, the fixture projecting outward from the side surface of the case and the fixture extending substantially in a vertical direction when the case is fixed to the mounting surface;

a first roof that extends over and covers an area above the aperture so as to receive water drops flowing down along the side surface of the case to thereby prevent the water drops from reaching the aperture, the first roof projecting outward from the side surface of the case; and a first reinforcement that connects a portion of the fixture to the side surface of the case to reinforce the fixture, the portion of the fixture including an end portion of the fixture that extends in the vertical direction, wherein the first roof and the first reinforcement are a single piece of material, the fixture is formed on a first end of the side surface, the first end of the side surface being an end in a horizontal direction, and the aperture is formed on a second end opposite to the first end of the side surface in the horizontal direction, and the first roof projects from the side surface by a lesser amount at the second end of the side surface as compared to at the first end of the side surface.

* * * * *